US009361409B2

(12) United States Patent
Kozloski et al.

(10) Patent No.: US 9,361,409 B2
(45) Date of Patent: Jun. 7, 2016

(54) AUTOMATIC DRIVER MODELING FOR INTEGRATION OF HUMAN-CONTROLLED VEHICLES INTO AN AUTONOMOUS VEHICLE NETWORK

(71) Applicant: International Business Machines Corporation, Armonk, NY (US)

(72) Inventors: James R. Kozloski, New Fairfield, CT (US); Timothy M. Lynar, Kew (AU); Cristian Vecchiola, Victoria (AU)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 648 days.

(21) Appl. No.: 13/738,317

(22) Filed: Jan. 10, 2013

(65) Prior Publication Data
US 2014/0195213 A1 Jul. 10, 2014

(51) Int. Cl.
*G06G 7/48* (2006.01)
*G06F 17/50* (2006.01)
*G08G 1/01* (2006.01)

(52) U.S. Cl.
CPC ........ *G06F 17/5009* (2013.01); *G06F 17/5095* (2013.01); *G08G 1/0112* (2013.01); *G08G 1/0129* (2013.01)

(58) Field of Classification Search
CPC .......................... G06F 17/5009; G06F 17/5095
USPC ............................................................ 703/8
See application file for complete search history.

(56) References Cited

U.S. PATENT DOCUMENTS

| 6,505,780 | B1 | 1/2003 | Yassin et al. |
| 6,720,920 | B2 | 4/2004 | Breed et al. |
| 6,728,605 | B2 | 4/2004 | Lash et al. |
| 7,202,776 | B2 | 4/2007 | Breed |
| 7,389,178 | B2 | 6/2008 | Raz et al. |
| 7,961,906 | B2 | 6/2011 | Ruedin |
| 8,078,349 | B1* | 12/2011 | Prada Gomez et al. ......... 701/23 |
| 8,520,695 | B1* | 8/2013 | Rubin et al. .................. 370/445 |
| 2008/0262670 | A1 | 10/2008 | McClellan et al. |
| 2009/0192705 | A1 | 7/2009 | Golding et al. |
| 2011/0010023 | A1 | 1/2011 | Kunzig et al. |
| 2011/0021234 | A1* | 1/2011 | Tibbitts ................. H04W 48/04 455/517 |
| 2011/0301786 | A1* | 12/2011 | Allis .................... G05D 1/0038 701/2 |
| 2012/0083960 | A1 | 4/2012 | Zhu et al. |

(Continued)

OTHER PUBLICATIONS

Ehlert et al.("Microscopic traffic simulation with reactive driving agents", IEEE, 2001, pp. 861-866).*

(Continued)

*Primary Examiner* — Omar Fernandez Rivas
*Assistant Examiner* — Iftekhar Khan
(74) *Attorney, Agent, or Firm* — Cantor Colburn LLP; Vazken Alexanian

(57) ABSTRACT

Automatic driver modeling is used to integrate human-controlled vehicles into an autonomous vehicle network. A driver of a human-controlled vehicle is identified based on behavior patterns of the driver measured by one or more sensors of an autonomous vehicle. A model of the driver is generated based on the behavior patterns of the driver measured by the one or more sensors of the autonomous vehicle. Previously stored behavior patterns of the driver are then retrieved from a database to augment the model of the driver. The model of the driver is then transmitted from the autonomous vehicle to nearby vehicles with autonomous interfaces.

12 Claims, 4 Drawing Sheets

(56) References Cited

U.S. PATENT DOCUMENTS

| | | | | |
|---|---|---|---|---|
| 2013/0084847 | A1* | 4/2013 | Tibbitts et al. | 455/419 |
| 2013/0274955 | A1* | 10/2013 | Rosenbaum | G06F 17/00 701/1 |
| 2013/0311041 | A1* | 11/2013 | Lynar | G08G 1/0112 701/41 |
| 2014/0156176 | A1* | 6/2014 | Caskey et al. | 701/117 |
| 2014/0172397 | A1* | 6/2014 | Drew et al. | 703/8 |
| 2014/0192181 | A1* | 7/2014 | Taylor | B60C 23/0408 348/118 |
| 2014/0195102 | A1* | 7/2014 | Nathanson | G07C 5/0808 701/31.4 |
| 2015/0006132 | A1* | 1/2015 | Matsumura | 703/2 |

OTHER PUBLICATIONS

Földös et al.("Sensor-net for Monitoring Vital Parameters of Vehicle Drivers",Acta Polytechnica Hungarica, 2007, pp. 25-36).*

Pasetto et al.("How the Interpretation of Drivers' Behavior in Virtual Environment Can Become a Road Design Tool: A Case Study", 2011, pp. 1-10).*

Al-Shihabi et al.("A Framework for Modeling Human-like Driving Behaviors for Autonomous Vehicles in Driving Simulators", Proceedings 5th International Conference on Autonomous Agents, Jun. 2001, 286-291).*

PCT International Search Report and Written Opinion; International Application No. PCT/US2014/010283; International Filing Date: Jan. 6, 2014; Date of Mailing: May 27, 2014; pp. 1-14.

Quinlan, "Reality Check: The Self-Driving Car", Vehicles that Navigate Themselves Expected This Decade, CBC News, Jun. 11, 2012, 5 pages.

Aoude et al, "Threat Asessment for Safe Navigation in Environments with Uncertainty in Predictability", submitted to the Department of Aeronautics and Astronautics in partial fulfillment of the requirements for the degree of Doctor of Philosophy at the Massachusetts Institute of Technology, Aug. 2011, pp. 1-224.

Maurer et al, "A System Architecture for Autonomous Visual Road Vehicle Guidance", Intelligent Transportation System, 1997, IEEE Conference, pp. 578-583.

Bekiaris et al, "Standardisation, Implementation and Optimum Use of Advanced Driver Assistance and Vehicle Control Systems", Certh/ Hellenic Institute of Transport, pp. 161-174.

* cited by examiner

AUTOMATIC DRIVER MODELING FOR INTEGRATION OF HUMAN-CONTROLLED VEHICLES INTO AN AUTONOMOUS VEHICLE NETWORK

BACKGROUND

The present invention relates to autonomous vehicle networks, and more specifically, to the integration of human-controlled vehicles into an autonomous vehicle network through automatic driver modeling.

As vehicle transportation networks transform from roadways used by vehicles controlled almost entirely by human drivers into roadways for autonomous vehicles controlled wholly by onboard and remote servers, an interim period will occur when roads must be shared by both autonomous and human-controlled vehicles. Autonomous vehicles rely on a combination of inputs from onboard sensors, vehicle control computing resources, and communications between vehicles, and from remote servers engaged in, for example, scheduling of vehicle traffic and alerting autonomous vehicles of conditions that cannot be sensed or communicated locally.

Both interactions and communications between vehicles and with remote servers require standard autonomous interfaces between autonomous vehicles, their onboard sensors and control mechanisms, and the computing resources of other vehicles and remote servers. These interfaces may communicate details such as vehicle location, speed, and subsequent actions, which then allows other vehicles to plan their own actions and remote servers to schedule and control the actions of groups of vehicles effectively. Without these standard autonomous interfaces, communications between vehicles must be through onboard sensors and processed locally in the time available, much as a human relies on local biological sensors to control a vehicle.

SUMMARY

According to an embodiment, a computer-implemented method is provided for identifying, with a processing device, a driver of a human-controlled vehicle based on behavior patterns of the driver measured by one or more sensors of an autonomous vehicle. A model of the driver is generated based on the behavior patterns of the driver measured by the one or more sensors of the autonomous vehicle. Previously stored behavior patterns of the driver are then retrieved from a database to augment the model of the driver. The model of the driver is then transmitted from the autonomous vehicle to nearby vehicles with autonomous interfaces.

According to another embodiment, a computer system is provided for identifying, with a processing device, a driver of a human-controlled vehicle based on behavior patterns of the driver measured by one or more sensors of an autonomous vehicle. A model of the driver is generated based on the behavior patterns of the driver measured by the one or more sensors of the autonomous vehicle. Previously stored behavior patterns of the driver are then retrieved from a database to augment the model of the driver. The model of the driver is then transmitted from the autonomous vehicle to nearby vehicles with autonomous interfaces.

According to another embodiment, a computer system is provided for measuring behavior patterns of a driver of the human-controlled vehicle using one or more sensors coupled to the processor onboard the human-controlled vehicle. A dynamically updated model of the driver is generated using the behavior patterns measured by the one or more sensors. An identification of the driver and the model of the driver are transmitted to nearby vehicles with autonomous interfaces and to a remote server to store the generated model.

According to another embodiment, a method is provided for equipping a human-controlled vehicle with an onboard processor, the onboard processor executing a computer-implemented method comprising measuring, with a processing device, behavior patterns of a driver of the human-controlled vehicle using one or more sensors coupled to the onboard processor. A dynamically updated model of the driver is generated using the behavior patterns measured by the one or more sensors. An identification of the driver and the model of the driver are transmitted to nearby vehicles with autonomous interfaces and to a remote server to store the generated model.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments disclosed herein integrate human-controlled vehicles into an autonomous vehicle network through automatic modeling of a human driver. When an autonomous vehicle encounters a human-controlled vehicle, it is likely that the human-controlled vehicle will not have standard autonomous interfaces. Accordingly, the human-controlled vehicle is largely an unknown to the autonomous vehicle. The autonomous vehicle is then limited to reacting to the human-controlled vehicle in real time based on measurements of the vehicle in real time.

Embodiments of the present invention identify the driver of the human-controlled vehicle based on behavior patterns of the driver measured by one or more sensors of the autonomous vehicle and generate a model of the driver based on the measured behavior patterns. The model of the driver is then transmitted from the autonomous vehicle to nearby vehicles with autonomous interfaces and a remote central server to maintain efficient and effective autonomous vehicle transportation networks that can leverage the full advantages of vehicle-to-vehicle and vehicle-to-central server communication networks.

Figure 1:
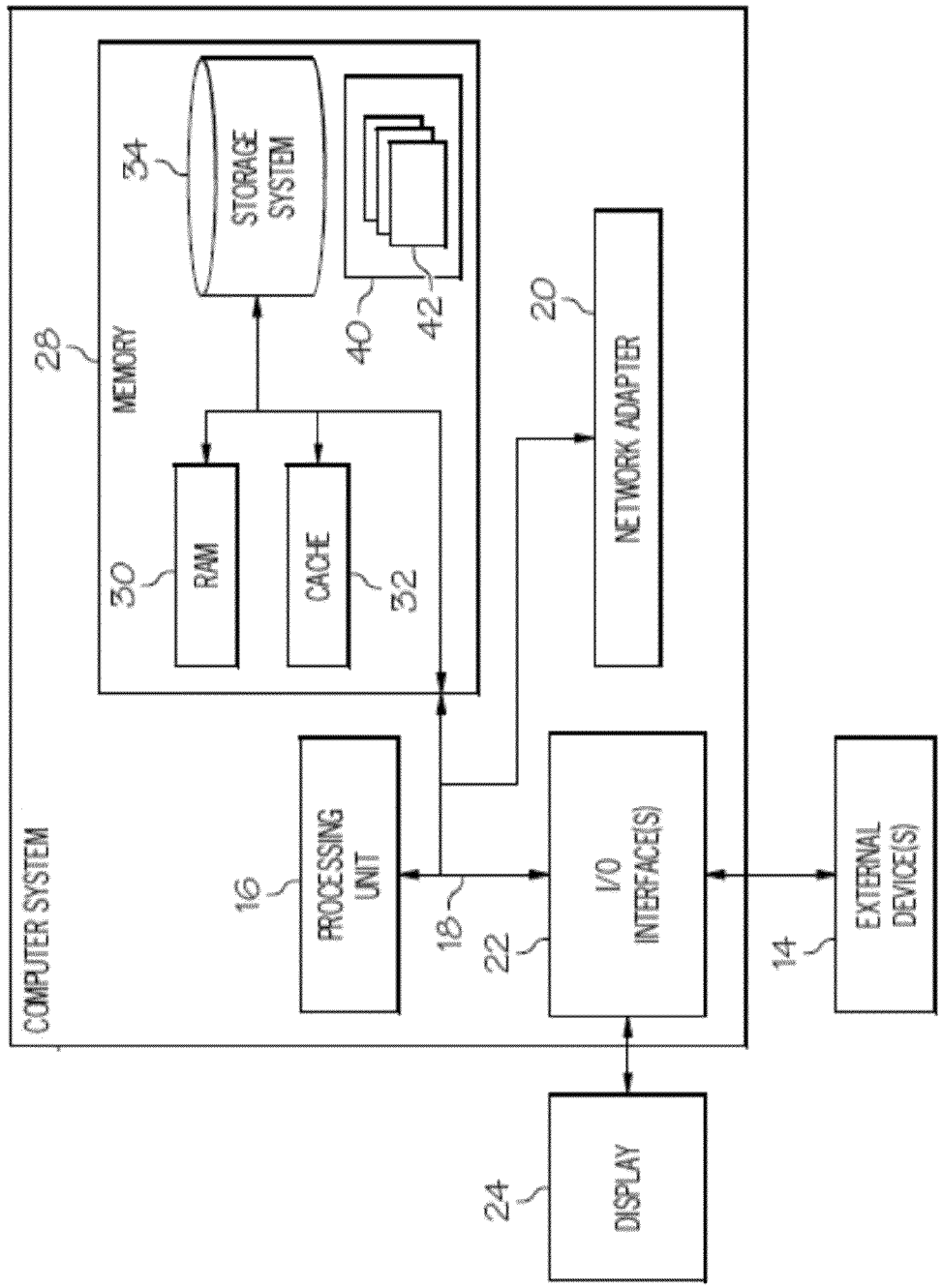
FIG. 1 depicts a block diagram of a computer system according to an embodiment of the present invention.

Referring now to FIG. 1, a block diagram of a computer system 10 suitable for integrating human-controlled vehicles into an autonomous vehicle network through automatic driver modeling according to exemplary embodiments is shown. Computer system 10 is only one example of a computer system and is not intended to suggest any limitation as to the scope of use or functionality of embodiments described herein. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system 10 is shown in the form of a general-purpose computing device. The components of computer system may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, and data archival storage systems, etc.

Figure 2:
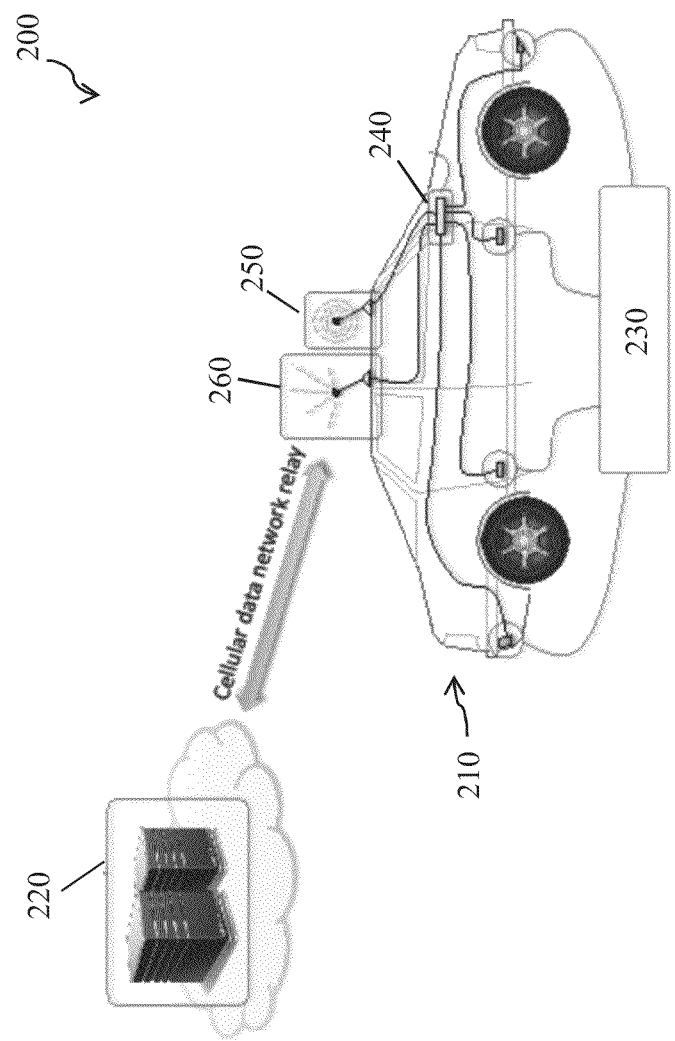
FIG. 2 depicts an automatic driver modeling system according to an embodiment of the present invention.

FIG. 2 illustrates an automatic driver modeling system 200 according to an embodiment of the present invention. The automatic driver modeling system 200 includes both software and hardware for sensing and collecting data about vehicles and transmitting the data among vehicles on the roadway. The automatic driver modeling system 200 comprises an autonomous vehicle 210 and a remote server 220.

The autonomous vehicle 210 comprises components for autonomous interfacing including, but not limited to, sensors 230, an onboard processing device 240, a wireless transmitter 250, and a cellular antenna 260. The sensors 230 observe and measure a behavior pattern of a driver of a human-controlled vehicle in the vicinity of the autonomous vehicle. The sensors 230 may include, but are not limited to, optical sensors such as cameras and audio sensors such as sonar and/or radar. These sensors are used to measure and compute a vehicle's speed, acceleration, directional changes, brake frequency, movements, and variations in the speed over a predetermined time.

The onboard processing device 240 includes an onboard data store containing data and models of individual drivers, and data and models of identified types and sub types of drivers. The onboard processing device 240 may be implemented on processing unit 16 in FIG. 1. The onboard processing device 240 performs the tasks of coordinating the interaction between sensors 230 to detect and acquire data about other vehicles and to identify the vehicles when possible, interacting with the remote server 220 to retrieve, update, and add a driver model, building and simulating a driver model of a driver by basing its computation on measurements from the sensors 230, and transmitting driver models and data to nearby vehicles with autonomous interfaces and to the remote server 220. The remote server 220 stores the driver data and models and performs processing upon the driver data and models. The remote server may be implemented on processing unit 16 of FIG. 1.

The wireless transmitter 250 may be used to communicate information including, but not limited to, driver data and models with nearby vehicles with autonomous interfaces. The cellular antenna 260 is used to connect to a cellular network for connecting to the remote server 220.

Figure 3:
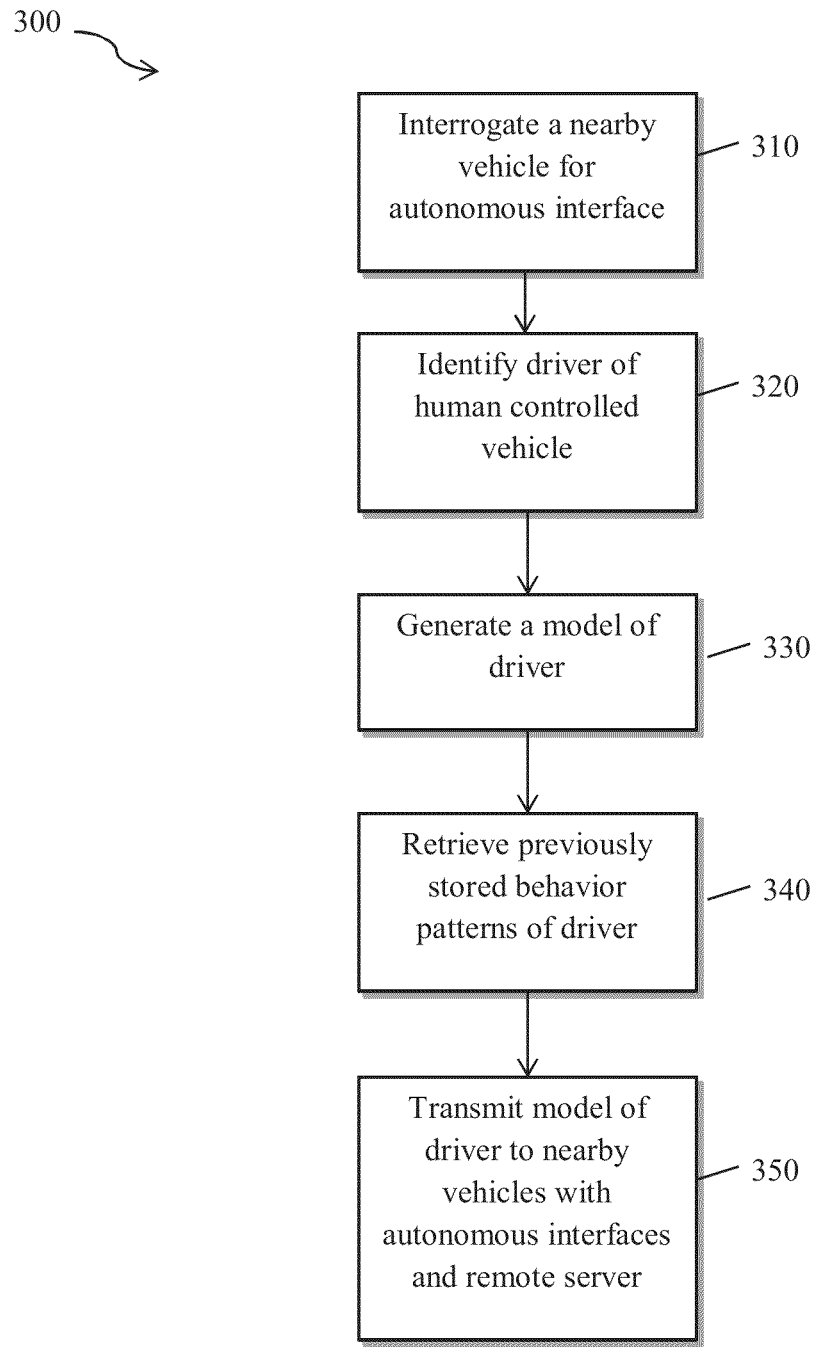
FIG. 3 depicts a flow diagram of a driver modeling operation for integrating human-controlled vehicles into an autonomous vehicle network according to an embodiment of the present invention.

With reference to FIG. 3, a flow diagram of a driver modeling operation 300 for integrating human-controlled vehicles into an autonomous vehicle network according to an embodiment is shown. In block 310, an autonomous vehicle probes a nearby vehicle on the roadway for the presence of autonomous interfaces. The autonomous interfaces serve to communicate vehicle parameters such as a vehicle's location, speed, and subsequent actions to the autonomous vehicle network, including autonomous vehicles and the remote server 220. If no autonomous interface is detected, the driver modeling operation 300 determines that the vehicle is human-controlled.

In block 320, a driver of a human-controlled vehicle is identified based on behavior patterns of the driver measured by the one or more sensors 230 of an autonomous vehicle 210. The autonomous vehicle 210 takes measurements of the behavior of the driver of the human-controlled vehicle and inputs these measurements to the onboard data store of the onboard processing device 240 for identification and modeling of the driver. According to an embodiment, the measurements may be relayed to a remote server 220 for similar identification and modeling.

The identification of the driver of the human-controlled vehicle may further include, but is not limited to, interrogating the human-controlled vehicle for driver identification data, analyzing registration information of the human-controlled vehicle, and recognizing the driver through a pattern matching algorithm. In other words, in addition to identifying the driver based on measured behavior pattern, the driver may be identified based on a communicated driver identifier or the identification of the driver may be narrowed based on the vehicle's registration number. Additionally, identification of the driver may occur rapidly based on known machine learning and pattern matching algorithms. For example, it is known in the art that patterns of human gait, facial recognition, and web surfing have been used to uniquely identify individual humans.

In block 330, a model of the driver is generated in real-time based on the behavior patterns of the driver of the human-controlled vehicle. This model may be as simple as estimates of the driver's reaction times under a variety of conditions, or as complex as predictions of a driver's next behavior based on Bayesian inference. According to an embodiment, the model of the driver allows vehicles with autonomous interfaces to anticipate the actions of the driver. The model of the driver may be generated using an onboard processing device 240 of the autonomous vehicle 210 or using a processing device of the remote server 220. According to an embodiment, the model of the driver is continually updated and augmented with new measurements of the driver behavior.

In block 340, previously stored behavior patterns of the driver are retrieved to augment the model of the driver. Measurements of the human-controlled vehicle, including a direct interrogation for human driver identification data, are analyzed and used to create a unique key or identifier for accessing additional data about the driver from the remote server 260. The retrieving of previously stored behavior patterns of the driver further comprises accessing the onboard data store or the remote server 220 using the unique identifier of the driver. The onboard processing device 240 of an embodiment may upload recently measured driver data, including behavior patterns of the driver, to the remote server 220 to maintain a dynamically updated model of the driver in the remote server 220.

The previously stored, driver-specific data stored in the remote server 220 is accessed with the unique driver identifier and is used to augment the parameterization of a remote or onboard model of the driver of the human-controlled vehicle. According to an embodiment, the autonomous vehicle 210 may use the remote server 220 to rapidly communicate historical data about a driver, thus allowing the model to be created much more rapidly than by observation of the driver's behavior alone. According to another embodiment, the entire model of the driver, which includes previously stored driver behavior data, may be downloaded to the onboard processing device 240 from the remote server 220. The remote server 220 may be accessed through a cellular antenna onboard the autonomous vehicle. According to another embodiment, the driver data stored in the remote server 220, including the behavior patterns of the driver, is accessible via the Internet using the unique driver identifier.

In block 350, the model of the driver is transmitted from the autonomous vehicle to nearby vehicles with autonomous interfaces and to the remote server 220 to maintain a dynamically updated model of the driver. The transmitted onboard or remote models of driver provide data about the human driver through autonomous interfaces to other autonomous vehicles allowing them to interact with the human-controlled vehicle as if it were autonomous and anticipate the driver's actions. The model of the driver is transmitted from the autonomous vehicle to nearby vehicles with autonomous interfaces through a wireless antenna onboard the autonomous vehicle 210.

According to an embodiment, the identification of the human driver does not depend on the human driving the same vehicle at all times, though the model may be further parameterized by the type of vehicle the identified driver is driving when encountered by the autonomous vehicle. For example, a remote server using a key generated from measurements observed by local autonomous vehicles may identify a rental car driver on a business trip to a new location. The model of the driver in the rental car is then rapidly created and simulated and is transmitted to nearby vehicles with autonomous interfaces.

Figure 4:
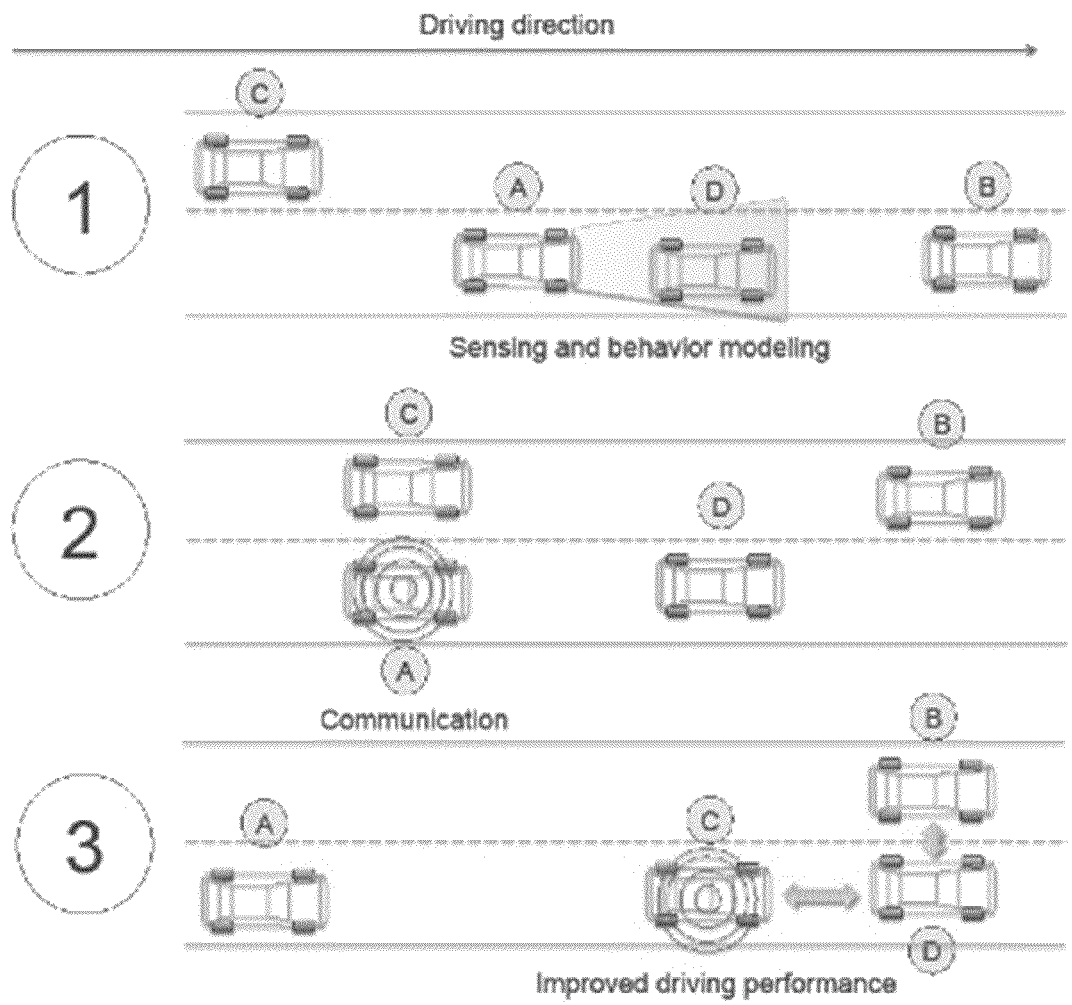
FIG. 4 depicts scenarios for the integration of human-controlled vehicles into an autonomous vehicle network according to an embodiment of the present invention.

Referring to FIG. 4, scenarios for the integration of human-controlled vehicles into an autonomous vehicle network according to an embodiment are illustrated. FIG. 4 illustrates a section of a roadway on an autonomous roadway network where vehicles A, B, and C are autonomous and incorporate an embodiment of the aforementioned invention. Vehicle D is human-controlled and without autonomous interfaces. In the example depicted, it is initially assumed in scenario 1 that Vehicle A is the closest vehicle to Vehicle D, Vehicle B is in front of Vehicle A, and Vehicle C is behind Vehicle A.

In scenario 1, when Vehicle A is within sensing distance of Vehicle D, Vehicle A begins to measure data on the driving behavior pattern and identification of Vehicle D. This data is used to create a model of the driving behavior patterns of Vehicle D. The model of Vehicle D is continuously updated and compared against previously stored models of the driver, so as to extrapolate a more complete model of the driver's behavior patterns. Information on Vehicle D, such as a registration identifier, may be used in conjunction with observations on driver behavior to identify the driver of the Vehicle D.

Vehicle A acquires the identity of the driver in Vehicle D and shares the model that Vehicle A has created of the driver of Vehicle D with a remote facility and nearby vehicles C and D. As shown in scenario 2, Vehicle A transmits the model to Vehicle C via wireless antenna when Vehicle C is within range of Vehicle A. The same operation is repeated when Vehicle B is within range of Vehicle A. Accordingly, when Vehicle D is within sensing and measuring range of Vehicles B and C in the future, Vehicles B and C will benefit from the model of the driver transmitted by Vehicle A, as shown in scenario 3.

For instance, if one attribute of the model of the driver of Vehicle D's indicated that the driver was likely to exhibit damped reactions in relation to the behavior of other vehicles, this information could be used by Vehicle C to increase the standard distance behind Vehicle D when the detected driver identity of the vehicle is the same as that in Vehicle D. Vehicle C continues sharing the information it received about the driver of Vehicle D with other nearby vehicles. This allows for a more robust solution, for example, in the case of lack of connectivity with the remote facility.

According to another embodiment, a human-controlled vehicle may be equipped with an onboard processor, the onboard processor executing the method comprising measuring behavior patterns of a driver of the human-controlled vehicle using one or more sensors coupled to the onboard processor, generating a dynamically updated model of the driver using the behavior patterns measured by the one or more sensors, and transmitting an identification of the driver and the model of the driver to nearby vehicles with autonomous interfaces and to a remote server to store the generated model.

In this embodiment, human-controlled vehicles may be instrumented with an onboard processor device, which taps into onboard vehicle sensors to continually update a dynamic model of the driver under various conditions. Accordingly, the human driver's identification and model is transmitted to nearby autonomous vehicles and remote servers. By carrying such a device onboard, the driver may be afforded special driving privileges by a regulatory body, such as the ability to access certain roadways dedicated primarily to autonomous vehicles, to pay decreased tolls, or any other incentives provided by a regulatory body to make the roadways more efficient.

The onboard processor device takes inputs from vehicle measurements, such as steering, speed, braking, and the like, and may combine them with measurements relayed from nearby autonomous vehicles to compute model parameters such as reaction times under a variety of road conditions. These measurements and correlations are then stored in a local database and modeling and simulation module. Onboard and relayed measurements can thereby be used to dynamically update a model of the driver. The driver model is then used to transmit autonomous interfaces to autonomous vehicles or remote servers on certain roadways.

The model of the driver may be updated continually, thus allowing a better model to be created and relayed to nearby vehicles that takes into account recent driver behavior, which may be affected by the current state of the diver (e.g., sleepy, agitated, in a hurry). According to an embodiment, the onboard processor device may include privacy controls.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer-implemented method, comprising:
identifying, with a processing device, a driver of a human-controlled vehicle based on behavior patterns of the driver measured by one or more sensors of an autonomous vehicle, wherein the human-controlled vehicle is not an autonomous vehicle, and wherein the driver identification comprises:
interrogating the human-controlled vehicle for the driver identification data;
receiving the driver identification data in response,
analyzing registration information of the human-controlled vehicle, and
identifying the driver using a pattern matching algorithm;
generating a model of the driver of the human-controlled vehicle by the autonomous vehicle based on the behavior patterns of the driver;
retrieving previously stored behavior patterns of the driver to augment the model of the driver; and
transmitting the model of the driver of the human-controlled vehicle by the autonomous vehicle to other nearby autonomous vehicles.

2. The computer-implemented method of claim 1, wherein an autonomous vehicle probes a nearby vehicle on a roadway for the presence of autonomous interfaces, the autonomous interfaces communicating vehicle parameters comprising a vehicle's location, a vehicle's speed, and a subsequent action of the vehicle.

3. The computer-implemented method of claim 1, wherein the autonomous vehicles are configured to anticipate actions of the driver of the human-controlled vehicle based on the model of the driver.

4. The computer-implemented method of claim 1, wherein the retrieving of previously stored behavior patterns of the driver further comprises:
accessing a remote server using a unique identifier of the driver; and
uploading recently measured behavior patterns of the driver to the remote server.

5. The computer-implemented method of claim 4, wherein the model of the driver is generated using a processing device onboard the human-controlled vehicle or a processing device of the remote server.

6. The computer-implemented method of claim 1, wherein the model of the driver, which includes previously stored behavior patterns of the driver, is further augmented with present measurements of driver behavior patterns.

7. The computer-implemented method of claim 1, wherein the one or more sensors comprise optical sensors and audio sensors for identifying the behavior patterns of the driver, the behavior patterns including a vehicle measurement selected from a group comprising a speed, an acceleration, a directional change, a movement, a brake frequency, and a variation in speed over a predetermined time.

8. The computer-implemented method of claim 1, wherein the transmitting of the model of the driver from the human-controlled vehicle to the autonomous vehicles is implemented through a wireless antenna onboard the human-controlled vehicle.

9. The computer-implemented method of claim 4, wherein the accessing of the remote server is implemented through a cellular antenna onboard the human-controlled vehicle.

10. The computer-implemented method of claim 4, wherein behavior patterns of the driver stored in the remote server is accessible via the Internet.

11. A method comprising:
- equipping autonomous vehicle with an onboard processor, the onboard processor executing a computer-implemented method comprising:
- identifying, with the onboard processor, a driver of a human-controlled vehicle based on behavior patterns of the driver measured by one or more sensors coupled to the onboard processor of the autonomous vehicle, wherein the human-controlled vehicle is not an autonomous vehicle, and wherein the driver is identified using a pattern matching algorithm by:
- interrogating the human-controlled vehicle for driver identification wherein the driver identification comprises:
    - receiving driver identification data, and
    - analyzing registration information of the human-controlled vehicle;
- generating a dynamically updated model of the driver using the behavior patterns measured by the one or more sensors; and
- transmitting an identification of the driver and the model of the driver of the human-controlled vehicle to other nearby vehicles with autonomous interfaces and to a remote server to store the generated model.

12. The method of claim 11, wherein the onboard processor of the autonomous vehicle receives information from a second onboard processor installed on the human-controlled vehicle, and wherein the installation of the second onboard processor grants special driving privileges on roadways to the driver of the human-controlled vehicle.

* * * * *